US011114843B2

United States Patent
Naidu et al.

(10) Patent No.: US 11,114,843 B2
(45) Date of Patent: Sep. 7, 2021

(54) METHOD AND SYSTEM FOR PROTECTION IN A MIXED LINE

(71) Applicant: ABB Power Grids Switzerland AG, Baden (CH)

(72) Inventors: Obbalareddi Demudu Naidu, Bangalore (IN); Vinay Kariwala, Howrah (IN)

(73) Assignee: ABB POWER GRIDS SWITZERLAND AG, Baden (CH)

( * ) Notice: Subject to any disclaimer, the term of this patent is extended or adjusted under 35 U.S.C. 154(b) by 100 days.

(21) Appl. No.: 15/772,060

(22) PCT Filed: Oct. 5, 2016

(86) PCT No.: PCT/IB2016/055939
§ 371 (c)(1),
(2) Date: Apr. 28, 2018

(87) PCT Pub. No.: WO2017/072612
PCT Pub. Date: May 4, 2017

(65) Prior Publication Data
US 2018/0316183 A1  Nov. 1, 2018

(30) Foreign Application Priority Data
Oct. 30, 2015 (IN) .......................... 5863/CHE/2015

(51) Int. Cl.
*H02H 7/26* (2006.01)
*H02H 1/00* (2006.01)
(Continued)

(52) U.S. Cl.
CPC ............ *H02H 7/265* (2013.01); *G01R 31/085* (2013.01); *H02H 1/0007* (2013.01); *H02H 3/08* (2013.01); *H02H 7/263* (2013.01)

(58) Field of Classification Search
CPC ............ H02H 7/26; H02H 7/265; H02H 1/00; H02H 1/0007; H02H 3/08; H02H 7/263; G01R 29/085; G01R 31/08; G01R 31/085
See application file for complete search history.

(56) References Cited

U.S. PATENT DOCUMENTS 8,942,954 B2   1/2015 Gong et al.
2006/0142964 A1* 6/2006 Saha ................... G01R 31/088
                                                             702/66
(Continued)

FOREIGN PATENT DOCUMENTS

EP      1020729 A2   7/2000
WO   2013071974 A2   5/2013

OTHER PUBLICATIONS

G. Ferreira et al., "Impedance-based fault location for overhead and underground distribution systems," N. Amer. Power Symposium (NAPS), IEEE, Sep. 9, 2012, 6 pages.
(Continued)

*Primary Examiner* — Son T Le
(74) *Attorney, Agent, or Firm* — Slater Matsil, LLP

(57) ABSTRACT

The invention provides a method and system for protection in response to a fault in a mixed line. The mixed line comprises two or more sections, with a first substation at a first end and a second substation at a second end. Every two consecutive sections of the mixed line are separated at a junction. The method is performed by an IED, and comprises obtaining one or more measurements of current at the first end, and one or more measurements of current at the second end. The method also comprises identifying a section of the two or more sections having the fault, by estimating a value of current for each junction and comparing the estimated value with the one or more measurements of current. In addition, the method comprises controlling a switching device based on the section identified with the fault.

6 Claims, 4 Drawing Sheets

(51) Int. Cl.
  *G01R 31/08* (2020.01)
  *H02H 3/08* (2006.01)

(56) References Cited

U.S. PATENT DOCUMENTS

| | | | | |
|---|---|---|---|---|
| 2007/0014059 A1* | 1/2007 | Altonen | ............... | G01R 31/086 361/42 |
| 2012/0068717 A1 | 3/2012 | Gong et al. | | |
| 2014/0104738 A1* | 4/2014 | Schweitzer, III | ........ | H02H 3/08 361/87 |
| 2014/0361785 A1* | 12/2014 | Radan | .................. | G01R 31/085 324/521 |
| 2015/0185748 A1* | 7/2015 | Ishchenko | .............. | G05B 15/02 700/293 |

OTHER PUBLICATIONS

European Patent Office, International Search Report for PCT/IB2016/055939, dated Jan. 16, 2017, 4 pages.
European Patent Office, Written Opinion of the International Search Authority for PCT/IB2016/055939, dated Jan. 16, 2017, 6 pages.
European Patent Office, International Preliminary Report on Patentability for PCT/IB2016/055939, dated May 1, 2018, 7 pages.

\* cited by examiner

METHOD AND SYSTEM FOR PROTECTION IN A MIXED LINE

CROSS-REFERENCE TO RELATED APPLICATIONS

This application is a U.S. national stage of International Application Serial No. PCT/IB2016/055939, filed Oct. 5, 2016, which claims priority to Indian Patent Application No. 5863/CHE/2015, filed Oct. 30, 2015. The entire disclosures of both of the foregoing applications are hereby incorporated by reference.

FIELD OF THE INVENTION

The present invention relates to protection from faults in a mixed power transmission line.

BACKGROUND OF THE INVENTION

A mixed power transmission line (mixed line) is a transmission line with non-uniform line impedance characteristics. In other words, a mixed line has at least two line sections, wherein impedance characteristic (e.g. surge impedance) of one section is different from impedance characteristic of the other section(s). Such a transmission line is preferred over a homogenous transmission line (i.e. a line with only one impedance characteristic) for a variety of reasons including, but not limited to, safety considerations, ease of accessibility of substations in thickly populated locations, ease of grid connection between countries with varying topology, and need for subsea electrification. An example where a mixed power transmission line is preferred instead of a homogenous transmission line, is when the transmission line is expected to traverse across natural vegetation, rivers etc.

As in case of a homogenous transmission line, faults may occur in a mixed power transmission line. Overhead sections of the mixed power transmission line are more prone to faults as they are exposed to disturbances such as lightning strikes, wind-borne debris and the like. In case of homogenous transmission lines, an auto-reclose functionality is utilized, albeit depending upon the type (underground/overhead) of the homogenous transmission line. Similar functionality can be used in mixed lines, however the auto-reclose functionality should be enabled only for overhead line sections. This is because the faults that occur in overhead transmission lines are generally transient (temporary) in nature, and therefore, such transient faults can be dealt with using an auto-recloser. However, in case of underground transmission lines, which are more prone to permanent faults, auto-recloser functionality should not be used.

Therefore, in case of power transmission networks comprising mixed transmission lines, auto-recloser functionality needs to be enabled in a selective manner in an Intelligent Electronic Device (IED). In case of occurrence of fault in an underground section, the auto-recloser function should be blocked, given the permanent nature of the fault. Accordingly, appropriate section (overhead section) in the line needs to be identified for such a switching device operation.

Two end synchronous measurement based traveling wave fault section identification is generally known. Traveling wave methods typically require high sampling frequency data, high bandwidth for communication and high end hardware, which is expensive. Traveling wave based fault location methods using support vector machines (SVM) to identify the fault section and subsection are also known. ATP (Alternative Transients Program) simulations are used to generate the fault data for training the SVM model in such methods. In practice, it is difficult to create and maintain high fidelity simulation models for training the SVM for deployment to a site.

In addition, accurate fault location in mixed lines is very important for maintenance crew to reach to a fault point and undertake repair work quickly. Fault location in a mixed line is challenging due to variance in surge impedances or impedance characteristics (e.g. X/R ratio).

Therefore, there is a need for low sampling frequency (less than about 4 KHz) based protection schemes.

SUMMARY OF THE INVENTION

Various aspects of the present invention provide a method and a system for protection in response to a fault in a mixed power transmission line (mixed line). A mixed line is a transmission line with non-uniform line impedance characteristics (e.g. varying surge impedances). In other words, a mixed line has two or more sections (or line sections), wherein a first section of the two or more sections has a first impedance characteristic and a second section of the two or more sections has a second impedance characteristic. For example, the mixed line can have two sections, with one of the two sections being an overhead section, and the other section being a cable section. Every two consecutive sections of the mixed line are separated at a junction. Accordingly, in case of a mixed line with two sections, there is one junction, and in case of a mixed line with three sections, there are two junctions and so forth. The two or more sections of the mixed line are located between a first substation at a first end of the mixed line, and a second substation at a second end of the mixed line.

The method is performed by an Intelligent Electronic Device (IED) of the mixed line. For example, the method may be performed by an IED associated with the first substation, an IED associated with the second substation etc. In the scenario of the method being performed by the IED of the first substation, the IED receives one or more signals from one or more measurement equipment of the first substation. The measurement equipment can include a current transformer (CT), a potential transformer (PT)/capacitive voltage transformer (CVT), a sensor-based measurement equipment (e.g. Rogowski coils, non-conventional instrument transformers etc.) and/or the like, which provides a signal corresponding to current, voltage or other information as sensed from the mixed line at the first end. For example, a current transformer provides single/multiple phase current signal and a potential transformer or capacitive voltage transformer can provide single/multiple phase voltage signal to the IED. Thus, the IED has one or more current and/or voltage measurements with it for the first end, according to the measurement equipment it is connected with. An IED with a low sampling rate can be used in accordance with various embodiments. For example, an IED which can collect 16 to 80 samples per cycle (e.g. cycle of 50 Hz), and extracts fundamental voltage and current phasors using a technique such as Fourier Transform or Discrete Fourier Transform (DFT), can be used.

In accordance with the method, the IED is connected with a communication channel. For instance, the IED can receive a communication from another IED (e.g. IED of the second substation, which operates in a similar manner at the second end of the line). Such communication between the IEDs can happen using standard communication messages (e.g. GOOSE, MMS etc.). In accordance with the method, the IED receives one or more measurements of current at the second end, over the communication channel.

The method further comprises estimating a value of current for each junction of the mixed line. The value of current for each junction is estimated based on current measurements corresponding to one of the two ends of the mixed line, and impedance characteristics of the sources and line/sections. For example, the value of current for each junction can be estimated from the one or more current measurements of current at the first end, equivalent source impedance of the first substation, equivalent source impedance of the second substation, and impedance of each section of the two or more sections. In one embodiment, the junction current for the $P^{th}$ junction as seen from the remote substation bus (N) is estimated using the following equation:

$$\Delta I_{JPCalculated} = \left(\frac{Z_{sM} + Z_1 + Z_2 + \ldots + Z_P}{Z_{sN} + Z_{P+1} + Z_{P+2} + \ldots + Z_K}\right) \times \Delta I_M$$

where, the line has of K (number) sections with P junctions and Z1, Z2 ... ZK are the impedances of each section, and $\Delta I_M$ is the difference between the pre-fault and post-fault current at bus (M). Similarly, the junction current for other junctions can be calculated taking into consideration the impedances till that junction.

Thereafter, the method comprises identifying a section of the two or more sections having the fault. The section with the fault is identified based on a comparison between the value of current estimated for each junction and the one or more measurements (actual) of current at one of the two ends. Consider a case where the estimate of junction current, is obtained using the measurements of current at first end. Assuming that the line has two sections, and the estimated value of current is greater than the actual measurement of current as sensed at the second end, then the section with the fault is concluded as the first section in accordance with one implementation. In such an implementation, if the estimated value is less than the actual measurement, then it is concluded that the fault is in the second section.

Assuming that the mixed line has three sections, the fault section can be identified as follows:

If the actual measured current at second end is less than the estimated currents for junction 1 and junction 2, then the fault is in first section;

If the actual measured current at second end is greater than estimated current for junction 1 and less than estimated current for junction 2, then the fault is in second section; and If the actual measured current at second end is greater than the estimated currents for junction 1 and junction 2, then the fault is in third section.

Subsequently, a switching device connected to the mixed line is controlled, according to the line section identified with the fault. For example, an auto-reclose operation may be performed through a switching device for protection in response to a fault. In such a case, the IED sends a command to control the switching device if an overhead section is detected to be faulty. Alternately, the auto-reclose operation is blocked as an underground section is detected to be faulty.

Here, the estimate of currents for junction 1 and junction 2 is obtained based on actual measurements of current at first end of the mixed line, and system parameters including line/section and source impedances. The location of the fault can also be identified by the IED. For example, the IED can determine the location of the fault according to the section with the fault. The location may be determined based on current measurements corresponding to the two ends of the mixed line, and impedance characteristics of the sources and line/sections.

BRIEF DESCRIPTION OF DRAWINGS

The subject matter of the invention will be explained in more detail in the following text with reference to exemplary embodiments which are illustrated in attached drawings in which.

DETAILED DESCRIPTION

The present invention provides a system and method for protection in response to a fault in a mixed power transmission line (referred to as 'mixed line' hereafter). The mixed line typically includes at least two line sections (or sections) having different impedance characteristics (for example different surge impedances). Every two consecutive line sections in a mixed line are connected at a junction.

Figure 1:
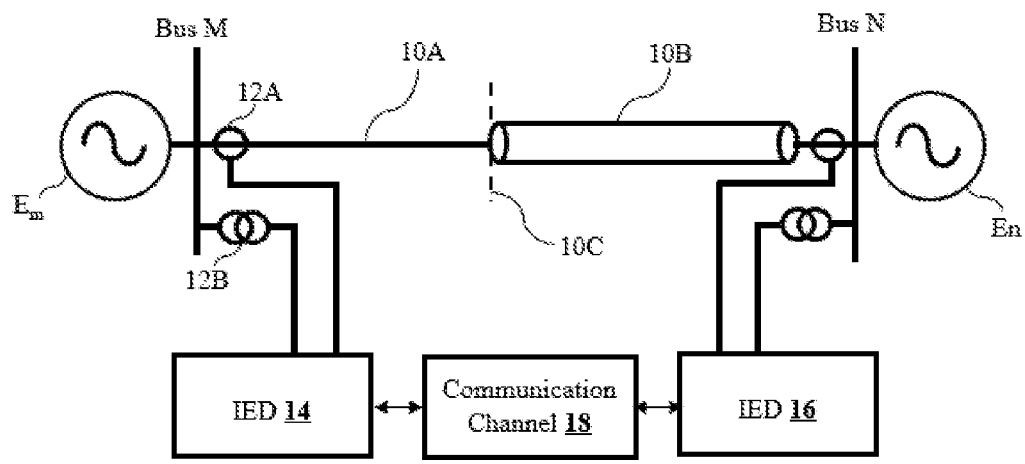
FIG. 1 is a simplified representation of a mixed line system, in accordance with an embodiment of the invention.

A mixed line is illustrated in FIG. 1. The mixed line illustrated includes one overhead line section (overhead section) denoted by a reference numeral 10A, and one cable section denoted by a reference numeral 10B. Further, the overhead section 10A is separated from the cable section 10B at a junction 10C. As illustrated, the mixed line connects a first substation ($E_M$) at a first end and a second substation ($E_N$) at a second end. The overhead section 10A of the mixed line originates at the substation $E_M$ and the cable section 10B terminates at the substation $E_N$ as shown in FIG. 1. Measurement equipment may be connected at one or more of the substations $E_M$ and $E_N$. The measurement equipment may be a Current Transformer (CT), a Potential Transformer (PT), capacitance coupled voltage transformer (CVT), a sensor-based measurement equipment etc.

In accordance with the embodiment shown in FIG. 1, the measurement equipment at the first substation include a current transformer 12A and a voltage transformer 12B. An Intelligent Electronic Device (IED) 14 is connected to voltage transformer 12B and current transformer 12A. Thus, IED 14 has current, voltage and/or other transmission line measurements of the first end. For example, current differential or line protection IED receives the current measurements from both sides of the line with sampling frequency of 1-4 KHz (directly through measurement equipment or using dedicated communication with IED at the other end). The measurements corresponds to the point in the mixed line, wherein the measurement equipment is connected. In case of A/C line, the measurement will reflect current/ voltage for each phase (of the multi-phase line). It should be noted that the method is not restricted to an A/C line, and can be implemented for a D/C line.

It would be apparent that IED 14 may be connected only with the current transformer, or it may receive a signal from other equipment, or from different type of equipment. Also, another IED 16 may be connected at a line section, junction or other location. IED 14 is connected to a communication channel 18. IED 14 can receive various communication over communication channel 18. For instance, IED 16 can communicate current and/or voltage measurements at the second end, over communication channel 18 to IED 14.

IED 14 utilizes the current measurements at the first end (e.g. from current signal received from current transformer) along with the current measurements at the second end (e.g. received over the communication channel), for handling faults in the mixed line. For example, IED 14 can sense a fault from the current signal received from the current transformer.

IED 14 accordingly estimates a value of current for each junction (e.g. 10C in FIG. 1), for identifying which section has a fault. The value of current for each junction is determined based on the current measurements of the first end along with impedances of the sources/sections. For example, IED 14 estimates a value of current flowing through each junction based on the one or more current measurements of current at the first end, equivalent source impedance of the first subsystem, equivalent source impedance of the second subsystem, and impedance of each section of the mixed line. The equivalent source impedances may be determined from current and voltage phasors, or provided as input to IED 14. In one embodiment, the junction current of the $P^{th}$ junction as seen from the remote substation bus (N) is estimated using the following equation:

$$\Delta I_{JPCalculated} = \left(\frac{Z_{sM} + Z_1 + Z_2 + \ldots + Z_P}{Z_{sN} + Z_{P+1} + Z_{P+2} + \ldots + Z_K}\right) \times \Delta I_M$$

where, the line has of K (number) sections with P junctions and Z1, Z2 . . . ZK are the impedances of each section, and $\Delta I_M$ is the difference between the pre-fault and post-fault current at bus (M). Similarly, junction current for other junction can be estimated using source and line/section impedances.

IED 14 compares the value of current estimated for each junction and the actual measurements of current at the second end, to obtain the section with the fault. IED 14 controls a switching device (not illustrated in figures) connected to the mixed line according to the section having the fault. For example, an auto-reclose function can be enabled according to the section having the fault. Here, IED 14 enables/blocks auto-reclosing functionality based on whether the section is an overhead section/underground cable section.

IED 14 can also determine the location of the fault in the section identified with the fault. The fault location is determined based on the current measurements of the first end and the second end along with impedances of the sources/sections. For example, IED 14 estimates the fault location based on the one or more current measurements of current at the first end, the one or more current measurements of current at the second end, equivalent source impedance of the first subsystem, equivalent source impedance of the second subsystem, and impedance of each section of the mixed line.

The following describes exemplary implementations of the method described herein. In accordance with the implementation, the method utilizes pre-fault and post-fault current measurements at local and remote bus of the mixed transmission line to identify the section with the fault. Consider the mixed line system shown in FIG. 1. Here, assume the total series impedance of the overhead section (10A) and the cable (10B) are denoted by $Z_{OHL}$ and $Z_{UGC}$, respectively. Also, $Z_{sM}$ and $Z_{sN}$ are the source impedances of the local and the remote end respectively. Assume that IED 14 has impedance characteristics of each section (i.e. characteristics of overhead line and cable section (e.g. per km impedances)). IED 14 also receives current data of both the sides (two ends of the mixed line).

Figure 2:
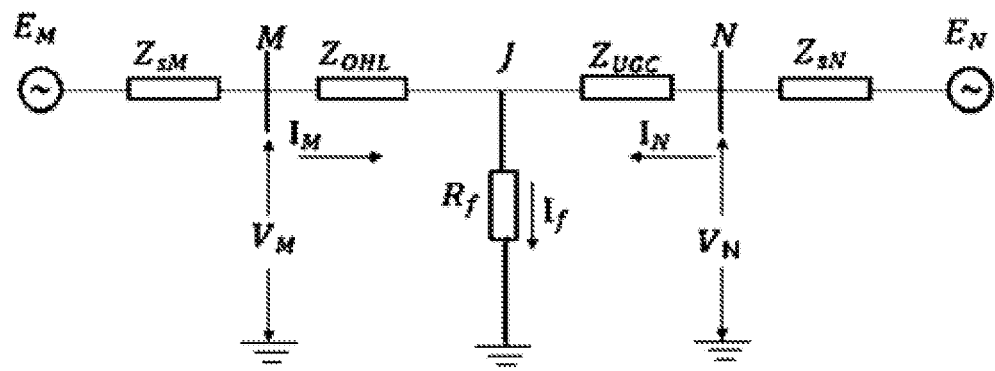
FIG. 2 is an exemplary circuit diagram illustrating a fault at a junction between an overhead section and a cable section.

Consider that the fault occurs at the junction in FIG. 1. The equivalent circuit diagram for this case is shown in FIG. 2, where $V_M$ and $I_M$ are the measured current and voltage at the local source end M, $V_N$ and $I_N$ are the measured current and voltage at the remote source end N, $R^f$ is the fault resistance and $I_f$ is the fault current.

Let $V_{Mf}$ and $I_{Mf}$ be the post-fault voltage and current phasors obtained from measurements at the local source end M, and $V_M$ and $I_M$ be the pre-fault voltage and current phasors. Similarly at the remote end N, let $V_{Nf}$ and $I_{Nf}$ be the post-fault voltage and current phasors obtained from measurements and $V_N$ and $I_N$ be the pre-fault voltage and current phasors. The estimated fault voltage and current components at both the ends can be calculated using:

$$\Delta V_M = (V_{Mf} - V_M); \Delta I_M = (I_{Mf} - I_M) \quad (1)$$

$$\Delta V_N = (V_{Nf} - V_N); \Delta I_N = (I_{Nf} - I_N) \quad (2)$$

The equivalent source impedances at the first substation and the second substation can be determined using:

$$Z_{sM} = -\left(\frac{\Delta V_M}{\Delta I_M}\right); Z_{sN} = -\left(\frac{\Delta V_N}{\Delta I_N}\right) \quad (3)$$

Figure 3:
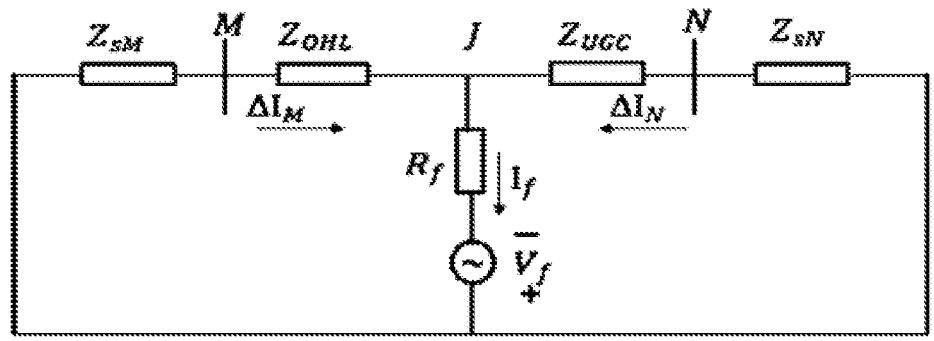
FIG. 3 is an exemplary circuit diagram illustrating a pure fault network for the fault at the junction between the overhead section and the cable section.

Using the superposition principle, the network during a fault is decomposed into pre-fault and pure fault network. The pure fault circuit diagram has been shown in FIG. 3. From the circuit diagram, equations (4) and (5) can be obtained:

$$\Delta I_M \times (Z_{sM} + Z_{OHL}) + R_f I_f = V_F \quad (4)$$

$$\Delta I_N \times (Z_{sN} + Z_{UGC}) + R_f I_f = V_F \quad (5)$$

From equations (4) and (5), an estimated value of current at the junction J as seen from end N ($\Delta I_{NCalculated}$) can be obtained using equation (6):

$$\Delta I_{NCalculated} = \left(\frac{Z_{sM} + Z_{OHL}}{Z_{sN} + Z_{UGC}}\right) \times \Delta I_M \quad (6)$$

In the above, $Z_{sM}$ and $Z_{sN}$ can be obtained and substituted from equation (3) or source impedances are available in IED database. Hence equation (6) gives an estimated value of the junction current seen from the remote bus end, using local end measured current and system parameters for a fault at the junction of overhead and cable section.

Now the calculated fault current seen from remote bus N using equation (6) is compared with the actual measured fault current (measured at remote bus N). According to the comparison, the section with fault (i.e. overhead/cable) can be found. In one implementation, if estimated junction current is greater than the actual measured current, the overhead section has the fault, else the cable has the fault.

Thus, in accordance with the invention, an estimated value of current at the junction J as seen from end N can be obtained in case of fault in overhead or cable sections. Also, depending on the number of junctions, different estimates can be obtained for the corresponding junctions. Comparison of the estimates of the junction current values with the actual current measurements provides the section with the fault.

Assuming that the line has two sections, and the estimated value of current is greater than the actual measurement, then the section with the fault may be concluded as the first section in accordance with one implementation. In such an implementation, if the estimated value is less than the actual measurement, then it is concluded that the fault is in the second section.

Assuming that the mixed line has three sections, the fault section can be identified as follows:

If the actual measured current at second end is less than the estimated currents for junction 1 and junction 2 (estimated from actual measurement of current at first end and system parameters), then the fault is in first section;

If the actual measured current at second end is greater than estimated current for junction 1 and less than estimated current for junction 2, then the fault is in second section; and If the actual measured current at second end is greater than the estimated currents for junction 1 and junction 2, then the fault is in third section.

Figure 4:
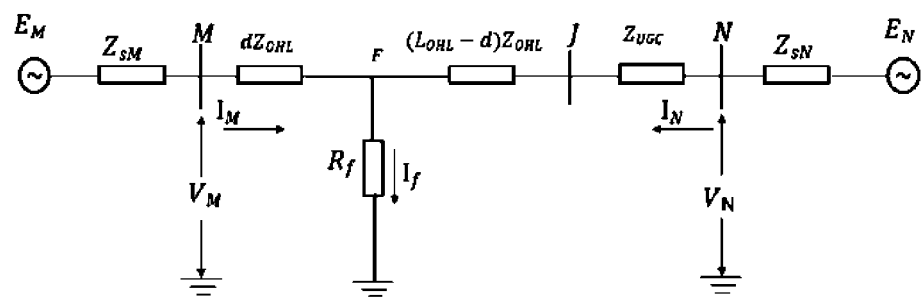
FIG. 4 is an exemplary circuit diagram for a fault in the overhead section.
Figure 5:
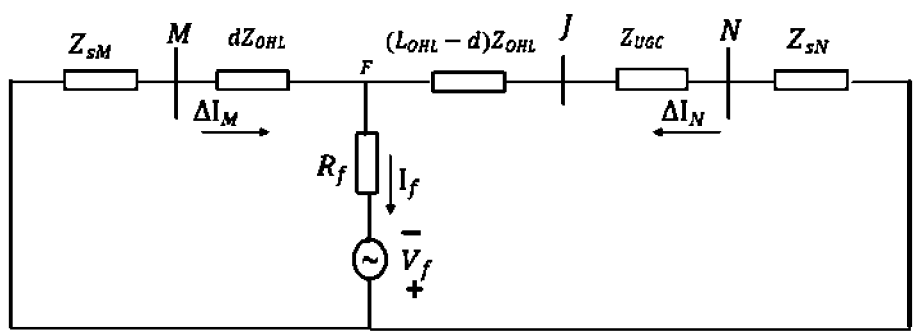
FIG. 5 is an exemplary circuit diagram illustrating a pure fault network for the fault in the overhead section.

In addition, the location of the fault can be determined according to the section having the fault. Consider a case, wherein the fault occurs in the overhead line section. The equivalent circuit diagram is shown in FIG. 4. Using the superposition principle, the network during a fault is decomposed into pre-fault and pure fault network. The pure fault circuit diagram has been shown in FIG. 5. From the circuit diagram the following equations (7) and (8) can be obtained:

$$\Delta I_M \times (Z_{sM} + dZ_{OHL}) + R_f I_f = V_F \quad (7)$$

$$\Delta I_N \times (Z_{sN} + (1-d)Z_{OHL} + Z_{UGC}) + R_f I_f = V_F \quad (8)$$

From equations (7) and (8). Abs ($\Delta I_N$) can be calculated as follows:

$$\text{Abs}(\Delta I_N) = \text{Abs}\left(\left(\frac{Z_{sM} + dZ_{OHL}}{Z_{sN} + (1-d)Z_{OHL} + Z_{UGC}}\right) \times \Delta I_M\right) \quad (9)$$

From equation (9), by equating the calculated and measured currents, the following equation 10 is obtained:

$$d = \text{Abs}\left(\frac{(Z_{sN} + Z_{OHL} + Z_{UGC})\Delta I_N - (Z_{sM} \Delta I_M)}{Z_{OHL}(\Delta I_M + \Delta I_N)}\right) \quad (10)$$

The fault location (d) can be obtained using equation (10). Similarly, in case of fault in cable section, the fault location can be obtained using the following equation (11):

$$d = L_{OHL} + \text{Abs}\left(\frac{(Z_{sN} + Z_{UGC})\Delta I_N - (Z_{sM} + Z_{OHL})\Delta I_M}{Z_{UGC}(\Delta I_M + \Delta I_N)}\right) \quad (11)$$

In an implementation, one or more of the abovementioned equations (e.g. equation 9, 10, 11 etc.) are solved by separating real and imaginary parts of the corresponding electrical parameters. Here, various components of the equation may be substituted by real and imaginary counterparts. For example, ($\Delta I_m \times Z_{SM}$) may be substituted by $k_1+j^*k_2$, ($\Delta I_m \times Z_L$) may be substituted by $k_3+j^*k_4$ etc. Thereafter, the distance 'd' can be obtained by solving the polynomial equation arrived at after making abovementioned substitutions. Finally, a solution of the polynomial equation can be selected according to its feasibility (e.g. solution being real and positive, and within system boundaries).

Figure 6:
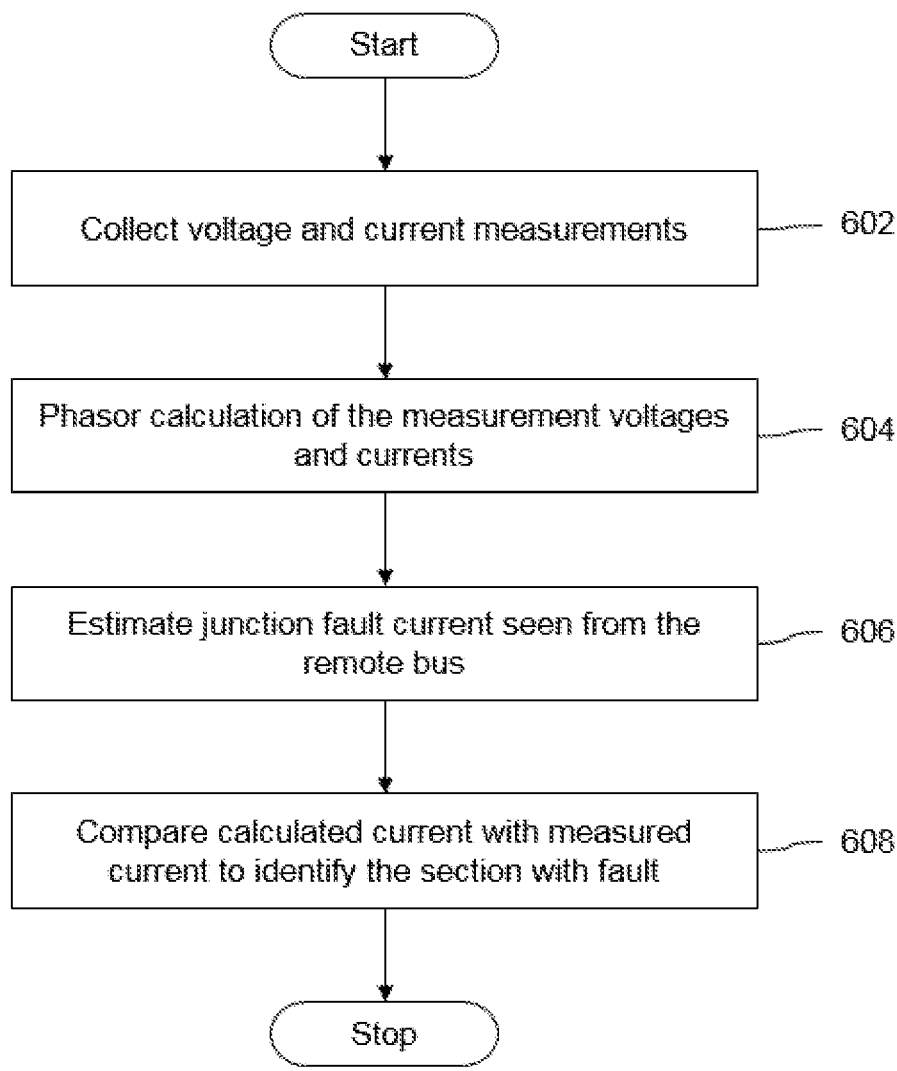
FIG. 6 is a flowchart of a method for identifying a section with the fault, in accordance with an embodiment of the invention.

FIG. 6 is a flowchart of the method for identifying the section with the fault, in accordance with an embodiment of the invention. At 602, voltage and current measurements are taken from Potential transformer (PT) and current transformer (CT), respectively. At 604, phasor calculation of the measured voltages and currents is performed (e.g. using Discrete Fourier transform (DFT)). The junction fault current as seen from the remote bus is estimated using the local current and system parameters at 606. The conclusion about identification of fault section is derived by comparing the calculated and measured current at 608. Accordingly, the fault can be determined to be in the overhead section or cable section.

Figure 7:
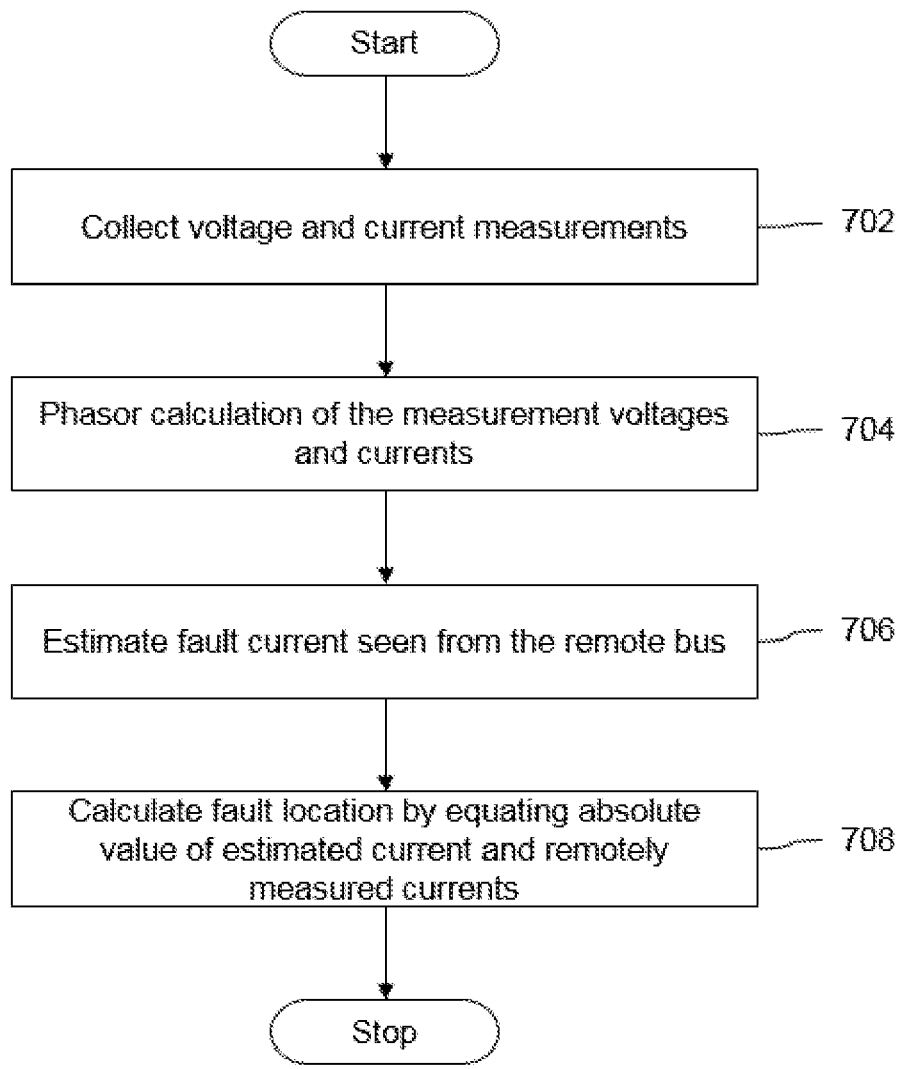
FIG. 7 is a flowchart of a method for locating the fault, in accordance with an embodiment of the invention.

FIG. 7 is a flowchart of the method for identifying the location of the fault, in accordance with an embodiment of the invention. At 702, voltage and current measurements are taken from PT and CT, respectively. At 704, phasor calculation of the measured voltages and currents is performed (e.g. using Discrete Fourier transform (DFT)). The fault current seen from remote bus M is estimated using local measured current, fault location and system parameters at 706. The fault location is calculated by equating the absolute value of estimated and remote measured currents at 708.

Methods presented herein can be used for other different mixed line combinations such as OHL connected with cable and then connected with OHL (OHL+UGC+OHL), Cable connected with OHL and then connected to Cable (UGC+OHL+UGC) etc. Thus, the invention enables detection at an IED the section having a fault based on information measured at the IED and communication received from another IED. The method enables robust fault section/location identification using two ended current signal information for mixed line. The method is a two end current based method that requires low sampling frequency. Additionally, identification is independent of zero sequence impedance which is more uncertain parameter in mixed line configurations.

The invention claimed is:

1. A method for determining a location of a fault in a mixed line comprising two or more sections, with a first substation at a first end of the mixed line and a second substation at a second end of the mixed line, every two consecutive sections of the mixed line being separated at a respective junction, the method being performed by an Intelligent Electronic Device (IED), the method comprising:

obtaining one or more current measurements at the first end of the mixed line, from a current signal received from a measurement equipment of the first substation;

receiving one or more current measurements at the second end of the mixed line, over a communication channel;

estimating a value of current for each junction of the mixed line using the one or more current measurements at the first end, an equivalent source impedance of the first substation, an equivalent source impedance of the second substation, and impedance of each section of the two or more sections of the mixed line, the estimating the value of current for each junction of the mixed line being performed without using any voltage measurement, a first section of the two or more sections having a first predetermined impedance characteristic, and a second section of the two or more sections having a second predetermined impedance characteristic different from the first impedance characteristic;

identifying a section of the two or more sections of the mixed line having the fault, based on a comparison between the value of current estimated for each junction and the one or more current measurements at the second end; and determining the location of the fault in the section of the mixed line identified as having the fault, using the one or more current measurements at the first end, the one or more current measurements at the second end, the equivalent source impedance of the first substation, the equivalent source impedance of the second substation, and the impedance of each section of the two or more sections.

2. The method of claim 1 further comprising controlling a switching device connected to the mixed line, according to the section having the fault.

3. The method of claim 1, wherein each section of the two or more sections has a respective predetermined impedance characteristic.

4. The method of claim 1, further comprising enabling an auto-reclose function in response to the section having the fault being an overhead section.

5. The method of claim 1, further comprising blocking an auto-reclose function in response to the section having the fault being an underground cable section.

6. The method of claim 1, wherein estimating the value of current for each junction comprises estimating the value of current at a Pth junction away from the second substation as:

$$\left(\frac{Z_{sM} + Z_1 + Z_2 + \ldots + Z_P}{Z_{sN} + Z_{P+1} + Z_{P+2} + \ldots + Z_K}\right) \times \Delta I_M$$

where the mixed line has K sections, $Z_1, Z_2, \ldots Z_K$ (are respective impedances of the K sections of the mixed line, $Z_{sM}$ is the equivalent source impedance of the first substation, $Z_{sN}$ is the equivalent source impedance of the second substation, and $\Delta I_M$ is a difference between pre-fault current and post-fault current at the first substation.

* * * * *